(12) United States Patent
Cheong

(10) Patent No.: US 6,610,352 B2
(45) Date of Patent: Aug. 26, 2003

(54) MULTIPLE SOURCE DEPOSITION PROCESS

(75) Inventor: Dan Daeweon Cheong, Mississauga (CA)

(73) Assignee: iFire Technology, Inc., Fort Saskatchewan (CA)

( * ) Notice: Subject to any disclaimer, the term of this patent is extended or adjusted under 35 U.S.C. 154(b) by 167 days.

(21) Appl. No.: 09/747,315

(22) Filed: Dec. 22, 2000

(65) Prior Publication Data

US 2002/0081371 A1 Jun. 27, 2002

(51) Int. Cl.$^7$ .............................................. C23C 14/54
(52) U.S. Cl. ...................... 427/8; 427/255.31; 427/596; 427/64; 427/66; 427/69; 427/70
(58) Field of Search ............................ 427/596, 64, 66, 427/69, 70, 255.31, 8

(56) References Cited

U.S. PATENT DOCUMENTS

| | | | |
|---|---|---|---|
| 4,242,370 A | | 12/1980 | Abdalla et al. |
| 5,043,614 A | | 8/1991 | Yockey |
| 5,372,837 A | * | 12/1994 | Shimoyama et al. .......... 427/8 |
| 5,432,015 A | | 7/1995 | Wu et al. |
| 5,505,986 A | * | 4/1996 | Velthaus et al. ............... 427/66 |
| 5,865,887 A | | 2/1999 | Wijaranakula et al. |

FOREIGN PATENT DOCUMENTS

| | | | |
|---|---|---|---|
| EP | 140 246 | | 5/1985 |
| EP | 0 740 490 A1 | | |
| EP | 0 720 418 | | 7/1996 10/1996 |
| EP | 0 740 490 | | 10/1996 |
| GB | 1065762 | | 4/1967 |
| GB | 1469230 | * | 4/1977 |
| JP | 61292894 | | 12/1986 |
| JP | 63259067 | | 10/1988 |
| JP | 2306591 | | 12/1990 |
| JP | 7263144 | | 10/1995 |
| JP | 11061386 | | 1/2001 |

OTHER PUBLICATIONS

Eguchi, K., et al., "Composition Self–Matching Phenomena in Chemical Vapor Deposition of Thin Films," Electrochemical Society Proceedings, vol. 98–3, p. 179–189. (no date available).

Kawahara T., et al., "Step Coverage and Electrical Properties of Films Prepared," Electrochemical Society Proceedings, vol. 98–3, p.190–195.

patent abstracts of Japan, vol. 013, No. 069 (C–569), Feb. 16, 1989, Abstract of Application No. 62091399.

* cited by examiner

Primary Examiner—Timothy Meeks
(74) Attorney, Agent, or Firm—Perkins Coie LLP

(57) ABSTRACT

A method for the deposition of a thin film of a predetermined composition e.g. a phosphor, onto a substrate, in which the composition is a ternary, quaternary or higher composition, especially a composition selected from the group consisting of thioaluminates, thiogallates and thioindates of at least one element from Groups IIA and IIB of the Periodic Table. In the embodiment, the method comprises placing a pellet of at least one sulfide on a first source and placing a pellet of at least one sulfide on a second source, with one pellet containing dopant. Vapor deposition onto the substrate is effected with separate electron beams. The rate of vaporizing of the sulfides is monitored with separate shielded coating rate monitors. The temperature of the sources is controlled to obtain the composition on the substrate. The method is particularly used for deposition of ternary or quaternary phosphors on substantially opaque substrates in electroluminescent devices.

18 Claims, 3 Drawing Sheets

MULTIPLE SOURCE DEPOSITION PROCESS

FIELD OF THE INVENTION

The present invention relates to a method for the deposition of a ternary, quaternary or similar composition, especially a phosphor, in which components of the composition are located on different sources. In particular, the compositions are thioaluminates, thiogallates or thioindates of Group IIA and Group IIB elements, and the sulphides that form such compounds are located on the different sources. A preferred method of deposition is electron beam vaporization. In particular aspects, the present invention relates to a method of improving the luminance and emission spectrum of phosphor materials, especially those used for full colour ac electroluminescent displays employing thick film dielectric layers with a high dielectric constant.

BACKGROUND TO THE INVENTION

Thin film electroluminescent (TFEL) displays are known and are typically fabricated on glass substrates. However, electroluminescent displays with thin film phosphors employing thick film dielectric layers fabricated on ceramic substrates, as exemplified by U.S. Pat. No. 5,432,015, provide greater luminance and superior reliability.

Thick film dielectric structures provide superior resistance to dielectric breakdown, as well as a reduced operating voltage. When deposited on a ceramic substrate, the thick film dielectric structure will withstand higher processing temperatures than TFEL devices on glass substrates. The increased tolerance to higher temperatures facilitates annealing of the phosphor films at higher temperatures, to improve luminosity. However, even with the enhanced luminosity that is obtained, electroluminescent displays employing a thick film dielectric layer have not achieved the phosphor luminance and colour coordinates needed to be fully competitive with cathode ray tube (CRT) displays. Moreover, recent trends in CRT specifications are to higher luminance and higher colour temperature. Some improvement has been realized by increasing the operating voltage of electroluminescent displays, but this increases the power consumption of the displays, decreases the reliability and increases the cost of operating electronics for the displays.

A high luminosity full colour electroluminescent display requires the use of red, green and blue sub-pixels. Optical filters are needed to achieve the required colour coordinates for each sub-pixel. Consequently, the thin film phosphor materials used for each sub-pixel must be patterned so that there is minimal attenuation of the emission spectrum for each colour of pixel by the optical filters. For relatively low-resolution displays, the required patterning can be achieved by depositing the phosphor materials through a shadow mask. For displays with high resolution, however, the shadow mask technique does not provide adequate accuracy, and photolithographic methods must be employed. Photolithographic techniques require the deposition of photoresist films and the etching or lift-off of portions of the phosphor film to provide the required pattern.

Deposition and removal of photoresist films and etching or lift-off of phosphor films typically require the use of solvent solutions that contain water or other protic solvents. Some phosphor materials, for example strontium sulphide are susceptible to hydrolysis, and water and protic solvents may degrade the properties of the phosphor materials.

The deficiencies in phosphor materials are most severe with the phosphors used for blue sub-pixels, and may be compensated for to some extent by increasing the area of the blue sub-pixels relative to the area of the red and green sub-pixels. However, such a design modification demands increased performance from the phosphor materials used for the red and green phosphor materials, and requires the use of higher display operating voltages. The higher operating voltages increase the power consumption of the display, decrease the reliability and increase the cost of operating the electronics of the display.

Traditionally, cerium-activated strontium sulphide for blue and manganese-activated zinc sulphide for red and green have been the phosphor materials of choice for full colour electroluminescent displays. The optical emission from these phosphor materials must be passed through an appropriate chromatic filter to achieve the necessary colour coordinates for red, green and blue sub-pixels, resulting in a loss of luminance and energy efficiency. The manganese-activated zinc sulphide phosphor has a relatively high electrical to optical energy conversion efficiency of up to about 10 lumens per watt of input power and the cerium activated strontium sulphide phosphor has an energy conversion efficiency of 1 lumen per watt, relatively high for blue emission. However, the spectral emission for these phosphors is quite wide, with that for the zinc sulphide-based phosphor spanning the colour spectrum from green to red and that for the strontium sulphide-based material spanning the range from blue to green. This necessitates the use of the optical filters to obtain acceptable colour coordinates. The spectral emission of the cerium activated strontium sulphide phosphor can be shifted to some degree towards the blue by controlling the deposition conditions and activator concentration, but not to the extent required to eliminate the need for an optical filter.

Alternate blue phosphor materials that have narrower emission spectra tuned to provide the colour coordinates required for blue sub-pixel have been evaluated. These include cerium activated alkaline earth thiogallate compounds, which give good blue colour coordinates, but have relatively poor luminosity and stability. Since the host materials are ternary compounds, it is relatively difficult to control the stoichiometry of the phosphor films. Europium-activated barium thioaluminate provides excellent blue colour coordinates and higher luminance, but it too is a ternary compound whose stoichiometry is difficult to control.

Vacuum deposition of phosphor films comprising europium-activated barium thioaluminate from a single source pellet using sputtering or electron beam evaporation has not yielded films with high luminosity. Improved luminance of barium thioaluminate phosphors has been achieved by using a hopping electron beam deposition technique to deposit films from two source pellets. The stoichiometry of the deposited film is controlled by controlling the relative dwell time of the electron beam impinging on each of the two source materials. However, this technique is not readily scalable to facilitate commercial production of large area displays and the process cannot be controlled to compensate for changes in the evaporation rates from the two sources as the deposition proceeds and the source pellets are depleted.

A method for the deposition of zinc sulphide thin films on transparent substrates was disclosed in JP 63-259067 of Shiro Kobayashi et al.

Improvements in methods of deposition of compositions, especially phosphors, to improve the luminance and emission spectrum of phosphor materials for electroluminescent displays employing thick film dielectric layers would be useful.

SUMMARY OF THE INVENTION

A method for the deposition of compositions e.g. phosphors, especially ternary and other chemically complex phosphors, has now been found.

Accordingly, one aspect of the present invention provides a method for the deposition of a thin film of a pre-determined composition onto a substrate, said composition comprising a ternary, quaternary or higher compound, comprising the steps of:

(i) placing a pellet of at least one sulphide on a first source and placing a pellet of at least one sulphide on a second source, the sulphides on the first and second sources being different, said sulphides being the components of said composition, at least one of the pellets on the first and second sources additionally containing dopant for the composition;

(ii) effecting vapour deposition of said composition on said substrate by simultaneously vaporizing the pellets on the first and second sources with separate electron beams; and (iii) monitoring the rate of vaporizing of sulphide from the first source with a first coating rate monitor and monitoring the rate of vaporizing of sulphide from the second source with a second coating rate monitor, said first coating rate monitor being shielded from deposition of sulphide from the second source and said second coating rate monitor being shielded from deposition of sulphide from the first source.

In a preferred embodiment of the present invention, said first and second coating rate monitors are at a distance from the respective sources that is substantially the same as the distance of the substrate from said sources.

In another embodiment, the temperature of said first and second sources is controlled. Preferably, the temperature of each of the first and second coating rate monitors is monitored and controlled.

In further embodiments, the composition is a thin film phosphor or a dielectric thin film.

In further preferred embodiments, said composition is selected from the group consisting of ternary, quaternary and higher compositions of at least one cation from Groups IIA and IIB of the Periodic Table, especially thioaluminates, thiogallates and thioindates of at least one cation from Groups IIA and IIB of the Periodic Table.

In other embodiments, sulphide is located at a third source, said third source having a coating rate monitor that is screened from the first and second sources, said rate of coating from the third source being monitored and controlled. In particular, the third coating monitor is at a distance from the third source that is substantially the same as the distance of the substrate from said source.

In further preferred embodiments, said substrate is opaque in the visible and infrared regions of the electromagnetic spectrum.

In another aspect, the present invention provides a method for the deposition of a thin film of a pre-determined composition onto a substrate, said composition comprising a ternary, quaternary or higher composition, comprising the steps of:

(i) placing a first deposit at a first source of a vapour deposition apparatus and placing a second deposit at a second source of the vapour deposition apparatus, said first and second deposits being different, components of said first and second deposits in combination forming said pre-determined composition;

(ii) determining temporal variation of deposition of said components onto said substrate from said first and second sources; and (iii) using said temporal variation for controlling said first and second sources so as to obtain homogeneous temporal deposition of said composition on the substrate by simultaneous vapour deposition from said sources.

In preferred embodiments of the method, said temporal variation is obtained by monitoring the rate of vaporizing from the first source with a first coating rate monitor and monitoring the rate of vaporizing from the second source with a second coating rate monitor, said first coating rate monitor being shielded from deposition from the second source and said second coating rate monitor being shielded from deposition from the first source.

In another embodiment, said monitoring is used as the determining of temporal deposition of step (ii). In particular, said monitoring of step (ii) may be used in step (iii).

BRIEF DESCRIPTION OF THE DRAWINGS

The present invention is illustrated by the embodiments shown in the drawings, in which.

DETAILED DESCRIPTION OF THE INVENTION

Figure 2:
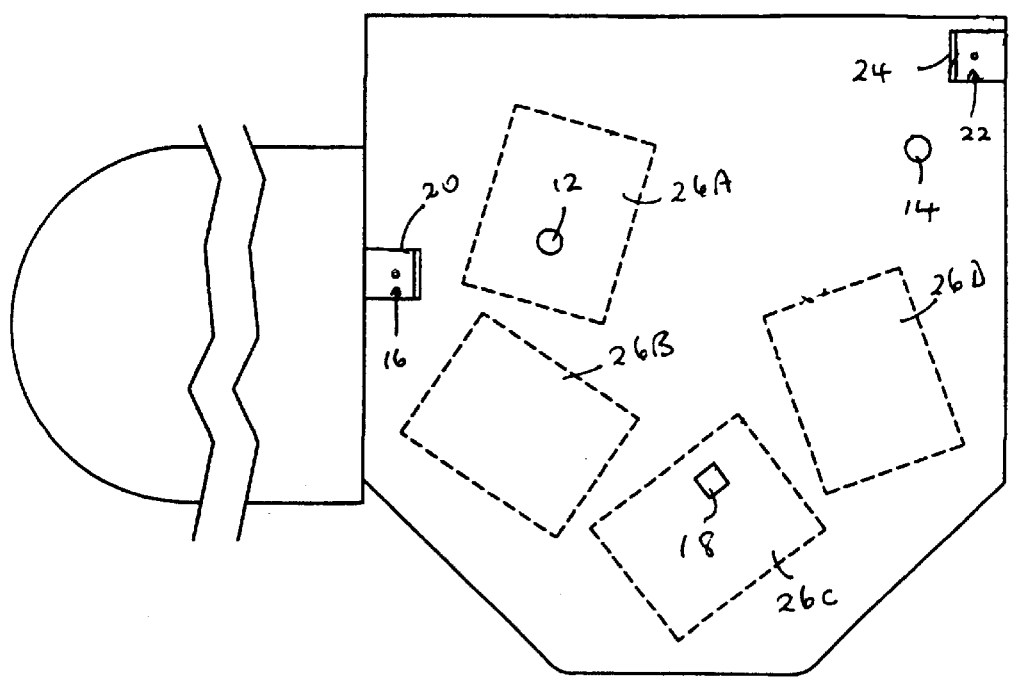
FIG. 2 is a schematic representation of a plan view of the dual electron beam evaporator of FIG. 1.

The present invention relates to a method of deposition of ternary, quaternary and higher compounds, including other chemically complex compositions, especially phosphors, to achieve the desired stoichiometry, and high energy efficiency and high luminosity phosphor films. Phosphors in the form of ternary, quaternary or higher compounds may be deposited to provide high electroluminescence. However, the ratio of the three or four, or more, constituent elements must be controlled to close tolerances. Control of stoichiometry is important in achieving optimum performance of the phosphor. In some embodiments of the invention, if the stoichiometry of the phosphor is not adequately controlled, the phosphor material may form into more than one crystal phase, thus reducing the luminosity and energy efficiency of the phosphor and shifting the colour coordinates of the emission spectrum from desired values. In the other embodiments, the phosphor may comprise a composite film with more than one crystal phase. In such embodiments, the light generation mechanism could involve a cascading excitation whereby the injected electrons activate a short wavelength of visible or ultraviolet light in one of the phases that subsequently excites a useful visible wavelength of light in a second or third phase. In these embodiments, control of the ratio of the relative abundance of the constituent phases is important to optimize the luminosity and colour coordinates of the composite phosphor materials.

In the present invention, control of stoichiometry during deposition is effected using two or more deposition sources with different chemical compositions, together with a deposition rate measuring system for at least two of the sources that measures the deposition rate for these sources independently from the deposition rate of the remaining source materials and a feedback system that controls the relative deposition rates commensurate with the measured rates. The invention is believed to be applicable to a variety of physical vapour deposition techniques including but not limited to electron beam evaporation, thermal evaporation, sputtering and reactive sputtering methods.

As exemplified hereinafter, phosphor materials comprising europium activated calcium thioaluminate ($CaAl_2S_4$:Eu), barium thioaluminate ($BaAl_2S_4$:Eu) and barium-calcium thioaluminate ($Ba_aCa_{1-a}Al_2S_4$:Eu) may be deposited using the method described herein and have shown high luminance and energy efficiency. It is believed that the method is also applicable to other ternary, quaternary or higher thioaluminate, thiogallate and thioindate phosphors and composites thereof synthesized with the cation or cations for these compounds selected from Groups IIA and IIB of the Periodic Table of Elements. Examples of such cations include barium, calcium, strontium, magnesium, zinc and cadmium. The method is also believed to be applicable to other ternary, quaternary or higher compositions, especially compositions formed with cations of Groups IIA and IIB of the Periodic Table. The utility of the invention also extends to the deposition of single phase ternary, quaternary or higher dielectric films that may be deposited in juxtaposition with the phosphor films to enhance phosphor performance.

The phosphor compositions may be activated with a variety of dopants, especially europium and cerium.

The method of the invention is believed to be applicable to any ternary, quaternary or higher composition deposited on a substrate. It will be understood that the various source materials would be selected so that a vapour may be created for condensation on the substrate. The preferred substrate is a substrate that is opaque in the visible and infrared regions of the electromagnetic spectrum. In particular, the substrate is a thick film dielectric layer on a ceramic substrate. Examples of such substrates include alumina, and metal ceramic composites.

As discussed herein, components of the phosphor are placed on each of the sources. For instance, if the phosphor is $CaAlS_4$:Eu, then $Al_2S_3$ is placed on one source and europium-doped CaS on the other source. If the phosphor is $Ba_aCa_{1-a}Al_2S_4$:Eu, then $Al_2S_3$ is preferably placed on one source and a europium-doped mixture of BaS and CaS, in the ratio's defined by "a" and "1-a", is placed on the other source.

In preferred embodiments, the phosphors are europium-activated barium-calcium thioaluminates, which are believed to be less susceptible to hydrolysis than cerium-activated strontium sulphide, thus rendering them easier to pattern using photolithographic techniques.

The present invention relates to a novel process for depositing multi-element thin films for electroluminescent phosphors and adjacent dielectric layers from which electrons are injected into the phosphors that provide a high luminosity and an emission color.

Figure 1:
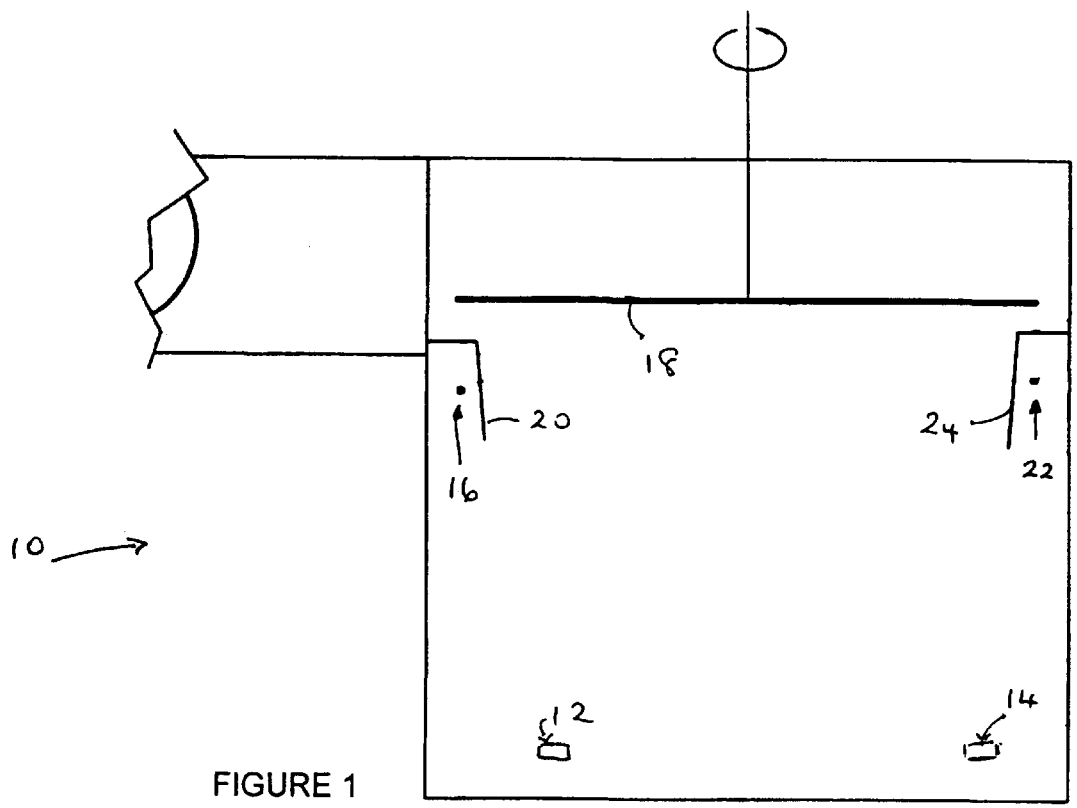
FIG. 1 is a schematic representation of a side view of a dual electron beam evaporator.

FIG. 1 shows a side view of the dual electron beam evaporator, which is an apparatus generally indicated by 10. Apparatus 10 has source materials 12 and 14. Crystal rate monitor 16 is located near substrate 18, and is behind shield 20. Shield 20 is located so that it receives depositions of evaporant from source material 12 but not from source material 14. Similarly, crystal rate monitor 22 is located near substrate 18, in a position opposed to crystal rate monitor 16, and is behind shield 24. Shield 24 is located so that it receives depositions of evaporant from source material 14 and not from source material 12.

Crystal rate monitors 16 and 22 are located juxtaposed to substrate 18, in a position that is preferably as near as is practical. Differences in distances can be allowed for in control of the method. Location of crystal rate monitors 16 and 22 spaced from source materials 12 and 14 but close to substrate 18 more accurately monitors the deposition of source materials on substrate 18.

Substrate 18 is rotatable, as indicated.

In operation, the respective samples of source material, as discussed herein, are placed as source materials 12 and 14. Separate electron beam guns are directed at each of source materials 12 and 14 and operated simultaneously. The flux density of evaporant from source material 12 is monitored by crystal rate monitor 16 and from source material 14 by crystal rate monitor 22. A computer-based feedback system is used to control the evaporation of each of source materials 12 and 14, using crystal rate monitors 16 and 22 respectively. Thus, the evaporation rate of each source material is independently controlled. Moreover, the independent control facilitates control of deposition of the phosphor on substrate 18, to achieve optimum performance for phosphors with ternary, quaternary or higher elemental composition. Substrate 18 is rotated during deposition.

It is understood that more than two source materials could be used, if appropriate to the phosphor composition.

The deposition of the composition may be carried out in an atmosphere of $H_2S$, sulphur or other volatile sulphur bearing compounds that will not contaminate the phosphor film as it is deposited if there is a tendency for the deposited compound to be deficient in sulphur. However, in some instances, it may be possible to operate the method without an atmosphere of $H_2S$.

It is to be understood that the sticking coefficient, also known as condensation rate, of an individual evaporant on the respective rate monitors may differ, and generally will differ, from the sticking coefficient of the evaporant when it is co-deposited onto the substrate. Thus, such differences in sticking coefficients must be understood in order to obtain optimization of the co-deposition on the substrate.

FIG. 2 shows a plan view of apparatus 10. In FIG. 2, there are four platforms 26A, 26B, 26C and 26D, all of which rotate. Substrate 18 is shown on platform 26C. It will be noted that source materials 12 and 14 are widely spaced apart, with each source material more closely aligned with the respective crystal monitors 16 and 22, and shields 20 and 24.

In an embodiment, the deposition apparatus comprises a Temescal™ electron beam evaporation system with four 40 cc source material pockets. The apparatus has two Temescal STIH-270-3CK electron beam guns and two independent deposition rate feedback control systems, each of which includes MDC e-Vap programmable sweep controllers, MDC e-Vap source controls, Sycon STC-200 deposition rate controllers and MDC e-Vap CVS-15KW electron beam power supplies. Other apparatus may be used.

Figure 3:
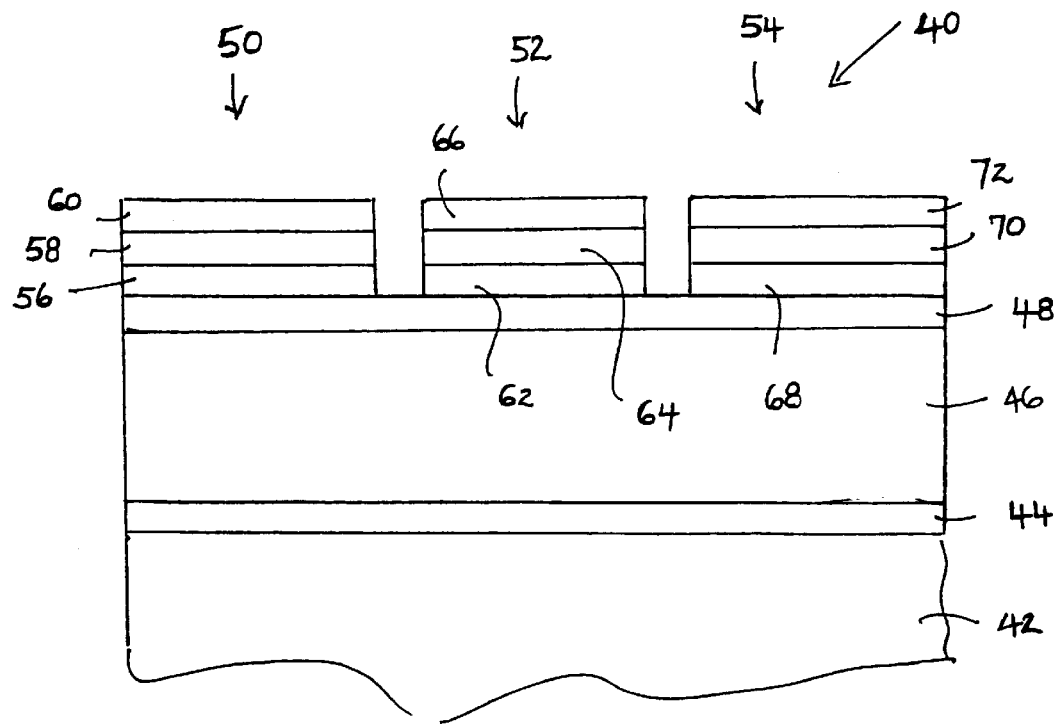
FIG. 3 is a schematic representation of a section of an electroluminescent element comprising a thick film dielectric layer and a phosphor composition.
Figure 4:
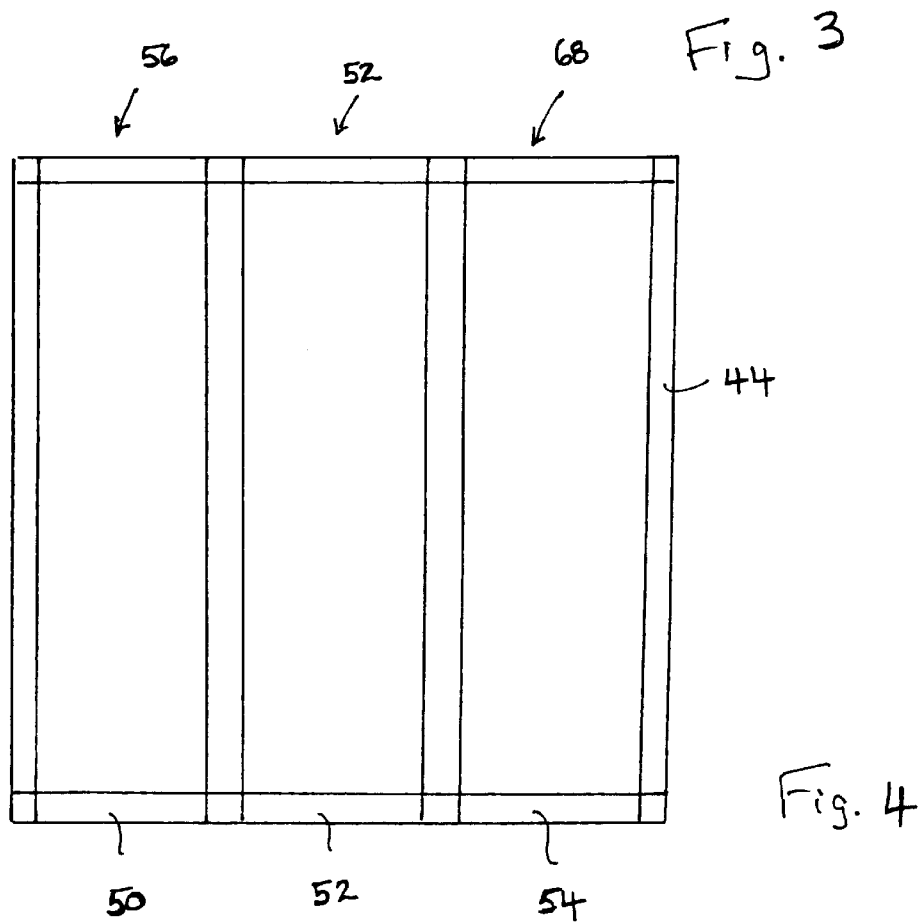
FIG. 4 is a schematic representation of a plan view of a full colour electroluminescent pixel and its constituent sub-pixels.

The present invention is further illustrated by the embodiment shown in FIGS. 3 and 4. FIG. 3 shows a cross-section of an electroluminescent device utilizing a phosphor. FIG. 4 shows a plan view of the electroluminescent device. The electroluminescent device, generally indicated by 40, has a substrate 42 on which is located row electrode 44. Thick film dielectric 46 has thin film dielectric 48 thereon. Thin film dielectric 48 is shown with three pixel columns, referred to as 50, 52 and 54, located thereon. The pixel columns contain phosphors to provide the three basic colours viz. red, green and blue. Pixel column 50 has red phosphor 56 located in contact with thin film dielectric 48. Another thin film dielectric 58 is located on red phosphor 56, and column electrode 60 is located on thin film dielectric 58. Similarly, pixel column 52 has green phosphor 62 on thin film dielectric 48, with thin film dielectric 64 and column electrode 66 thereon. Pixel column 54 has blue phosphor 68 on thin film dielectric 48, with thin film dielectric 70 and column electrode 72 thereon.

In another aspect, the present invention provides a method for the deposition of a thin film of a pre-determined composition onto a substrate, said composition comprising a ternary, quaternary or higher composition. In this embodiment, a first deposit is placed at a first source of a vapour deposition apparatus and a second deposit is placed at a second source of the vapour deposition apparatus. The first and second deposits are different, and may or may not be sulphides. For example, the deposits could be sulphides. The components of the first and second deposits in combination form the pre-determined composition. Simultaneous vapour deposition is effected from the first and second sources to form said pre-determined composition on said substrate. The simultaneous vapour deposition may be sputtering, electron beam, or thermal evaporation, or other kind of simultaneous vapour deposition. In this embodiment, the temporal variation of deposition of the components onto said substrate from the first and second sources is determined. The temporal variation is used for controlling the first and second sources e.g. by controlling the temperatures of the sources, so as to obtain homogeneous temporal deposition of the composition on the substrate by simultaneous vapour deposition from the sources.

In preferred embodiments of the method, the temporal variation is obtained by monitoring the rate of vaporizing from the first source with a first coating rate monitor and monitoring the rate of vaporizing from the second source with a second coating rate monitor. The first coating rate monitor is shielded from deposition from the second source and the second coating rate monitor is shielded from deposition from the first source. The monitoring is preferably used as the determining of temporal deposition of step (ii). In particular, the monitoring of step (ii) may be used in step (iii).

The present invention provides a method for depositing controlled composition multi-element thin films for use as electroluminescent phosphors that can be tuned by adjusting the film composition. Phosphors with a high luminosity and emission colour are obtained. The process entails the use of at least two source materials that can be deposited using for example, low pressure physical vapour deposition methods and deposition rate monitors placed in the deposition chamber that can independently measure the deposition rate of each source material. The rate monitors, combined with appropriate feedback control, can be used to control the compositions of deposited films that comprise the combined elemental composition of the source materials. Such films may comprise a ternary or quaternary elemental composition, but films including a larger number of elements are also possible by use of multiple sources. The luminosity and emission spectra of electroluminescent phosphor films can be optimized by controlling and adjusting the elemental composition of the films.

Thus, the present invention provides a method of deposition of ternary, quaternary or higher phosphor compositions, especially onto an opaque substrate. The method permits control of the relative rates of deposition from more than one source, to provide improved electroluminescent phosphors, especially phosphors of more consistent composition. The phosphors obtained are believed to exhibit higher luminosity and improved emission colour.

EXAMPLE I

A series of europium-doped barium calcium thioaluminate powders were prepared by blending powders of barium sulphide, calcium sulphide, aluminum sulphide and europium sulphide in various ratios. The blended powders were pressed to form pellets with a diameter of 1.3 cm and a height of 0.75 cm. In the series of samples, the fraction "a" in the formula $Ba_aCa_{1-a}Al_2S_4$:Eu was varied as follows: 0, 0.1, 0.3, 0.5, 0.7, 0.9 and 1.0. All of the phosphor materials had a nominal concentration of europium corresponding to 3 atomic percent of the sum of the barium and calcium concentrations. The pellets were annealed at 900° C. for 20 minutes in nitrogen.

The photoluminescence of the powders was evaluated by illumination of the powder under an ultraviolet light source. As the concentration of "a" was increased from 0 to 1, i.e. from $CaAl_2S_4$:Eu towards $BaAl_2S_4$:Eu, and the phosphor pellets were photo-stimulated using 365 nanometer ultraviolet light, it was found that the CIE colour coordinate "x" decreased from 0.17 to 0.15 and the CIE colour coordinate "y" decreased from 0.67 to 0.15. The photoluminescence decreased, from 98 to 45 cd/m$^2$. The colour of the pellets gradually changed from green to blue. The change in physical appearance of the pellets was also visible. For a=0.7 and below, the colour of the pellets was greenish to the unaided eye.

Figure 5:
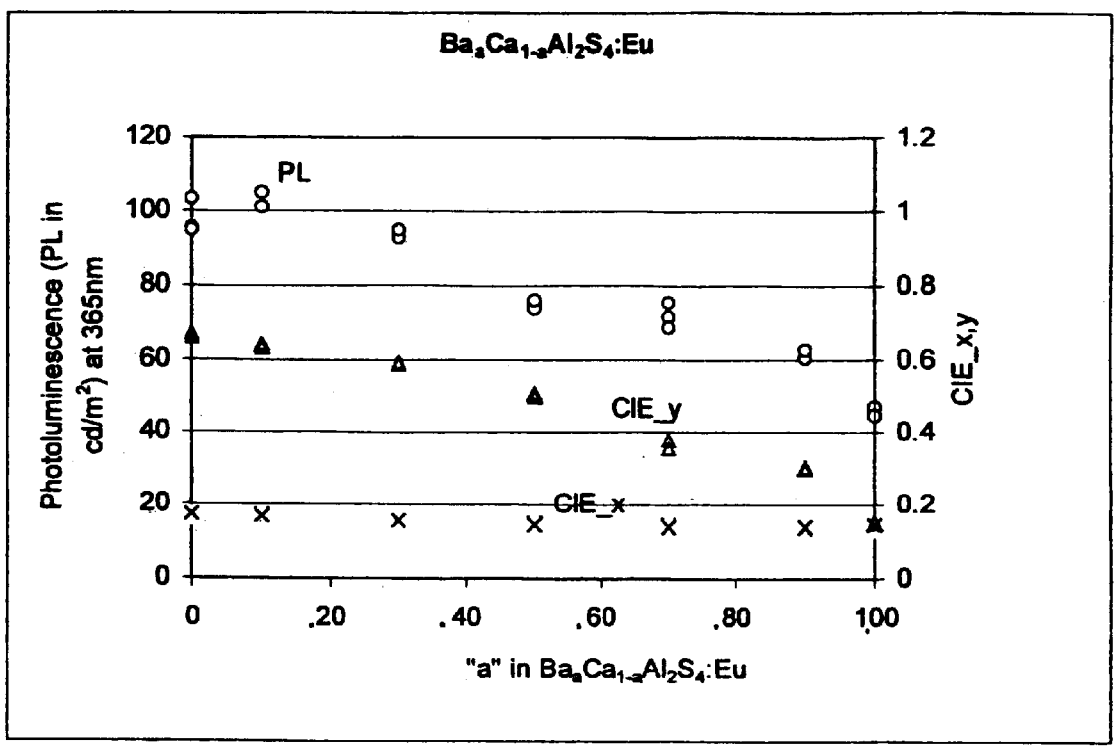
FIG. 5 is a graphical representation of photoluminescence and CIE colour versus "a" for phosphor materials having the formula $Ba_aCa_{1-a}Al_2S_4$:Eu incorporated into a thick film electroluminescent device.

The photoluminescent emission and colour coordinates for pellets with different values of "a" are shown in FIG. 5.

EXAMPLE II

A europium-doped calcium thioaluminate phosphor film of the type described in Example 1 with a=0 was formed on a thick film opaque substrate using the dual source method and apparatus described above.

One of the two source materials used to deposit the phosphor was aluminum sulphide ($Al_2S_3$) formed into a pellet. This pellet was not annealed. The other source material was a europium-doped calcium sulphide pellet (CaS:Eu). This pellet was annealed at 800° C. for 20 minutes in nitrogen. The diameter and height of each of the $Al_2S_3$ and CaS:Eu pellets were 2.5 and 1.8 centimeters, respectively. The pellets were slowly degassed and preconditioned with a low electron beam current from their respective electron guns.

The substrate was alumina upon which a gold electrode pattern was deposited and overlaid with a high dielectric constant thick film dielectric layer comprising PMN-PT coated with lead zirconate-titanate, and further overlaid with a thin film layer of alumina as described in U.S. patent application Ser. No. 09/540,288 of Wu et al. PMN-PT is a material that includes lead and magnesium niobates and titanates.

During phosphor deposition, both $Al_2S_3$ and CaS:Eu materials were vaporized simultaneously in an atmosphere having a hydrogen sulphide partial pressure of $2\times10^{-4}$ Torr. The deposition substrate temperature was about 500° C. The deposition rates of $Al_2S_3$ and CaS:Eu were 2.8 and 1.8 Angstroms per second, respectively, as measured independently using the two deposition rate monitoring systems. It is understood that the relative deposition rates need to be adjusted to account for differences between the sticking coefficient of the two source materials on the rate monitors, and the sticking coefficients for the combined materials on the workpiece substrate.

The thickness of the $CaAl_2S_4$:Eu phosphor film was 2300 Angstroms, as measured using scanning electron microscopy. Examples of structures incorporating the phosphor films are shown in cross section and in plan view in FIGS. 3 and 4. The deposited phosphors were annealed following deposition at a temperature of about 700° C. for 2 minutes under nitrogen. To complete the test device, a second thin film of alumina was deposited on top of the phosphor layer, and a second electrode structure comprising indium tin oxide was deposited on top of the alumina layer.

The phosphor obtained provided a relatively high energy conversion efficiency and a luminosity of 90 candelas per square meter with unfiltered CIE colour coordinates of x=0.19 and y=0.62 when operated at an excitation frequency of 120 Hz at a voltage of 70 volts above the threshold voltage of 190 volts and a pulse width of $30\mu$ seconds. The peak emission wavelength of both photoluminescence and electroluminescence spectra was 515 mn.

As a comparison, it was reported in JP 8-134440 of the Mitsui Mining & Smelting Ltd and Sharp Corporation, published May 28, 1996, that electroluminescent luminosity for sputtered thin films of $CaAl_2S$:Eu phosphor was 1 cd/m$^2$ at a 1 kHz excitation frequency with CIE coordinates of x=0.13, y=0.377. With the method of the present invention, the same phosphor material provided much higher luminosity and improved colour saturation, the luminosity being approximately two orders of magnitude higher.

EXAMPLE III

A phosphor film was prepared using the material described in Example 1 with a=1. The procedure used was the same as that described in Example I. For this phosphor, one pellet was formed from $Al_2S_3$ and the other pellet was formed from the required mixture of barium sulphide and europium sulphide. The thickness of the $BaAl_2S_4$:Eu phosphor film was 2700 Angstroms, measured using scanning electron microscopy.

As reported in Example I, for the composition corresponding to a=0, i.e. $CaAl_2S_4$:Eu, and using an excitation frequency of 120 Hz and a pulse width of $30\mu$ seconds, the electroluminescent pixel had a brightness of 90 cd/m$^2$ at 70 volts above the threshold voltage of 180 volts while its CIE colour coordinates were x=0.19 and y=0.62. This is reasonably similar to the photoluminescence values observed for the pellets having the same nominal composition.

For the composition corresponding to a=1, i.e. $BaAl_2S_4$:Eu, the luminance was about 40 cd/m$^2$ at 70 volts above the threshold voltage of 190 volts. The CIE colour coordinates were x=0.15 and y=0.14, which are again similar to the photoluminescence values observed for the pellets having the same nominal composition.

The similar results for the electroluminescent colour coordinates of the deposited films to those of the photoluminescence of pressed powders provide good evidence that the composition of the thin films was close to that for the corresponding powders and therefore that the dual source deposition method facilitates good control over the stoichiometry of the deposited films.

What is claimed is:

1. A method for the deposition of a thin film of a pre-determined composition onto a substrate, said composition comprising a ternary, quaternary or higher composition, comprising the steps of:
   (i) placing a pellet of at least one sulphide on a first source and placing a pellet of a least one sulphide on a second source, the sulphides on the first and second sources being different, said sulphides being the components of said composition, at least one of the pellets on the first and second sources additionally containing dopant for the composition;
   (ii) effecting vapour deposition of said composition on said substrate by simultaneously vaporizing the pellets on the first and second sources with separate electron beams; and
   (iii) monitoring the rate of vaporizing of sulphide from the first source with a first coating rate monitor and monitoring the rate of vaporizing of sulphide from the second source with a second coating rate monitor, said first coating rate monitor being shielded from deposition of sulphide from the second source and said second coating rate monitor being shielded from deposition of sulphide from the first source during said monitoring.

2. The method of claim 1 in which, in step (ii), the temperature of said first and second sources is controlled.

3. The method of claim 2 in which, in step (iii), the temperature of each of the first and second coating rate monitors is monitored and controlled.

4. The method of claim 3 in which said composition is selected from the group consisting of ternary, quaternary and higher compositions of at least one cation from Groups IIA and IIB of the Periodic Table.

5. The method of claim 3 in which, in step (i), sulphide is located at a third source, said third source having a coating rate monitor that is screened from the first and second sources, said rate of coating from the third source being monitored and controlled.

6. The method of claim 3, wherein said method additionally comprises placing a pellet at a third source, said third source containing said dopant, said third source having a coating rate monitor screened from the first and second sources, said rate of coating from the third source being monitored and controlled.

7. The method of claim 3 in which, in step (iii), vapour deposition is carried out in an atmosphere of $H_2S$.

8. The method of claim 3 in which the substrate temperature is monitored.

9. The method of claim 1 in which the composition is a thin film phosphor.

10. The method of claim 9 in which the composition deposited on the substrate is a single crystal phase.

11. The method of claim 9 in which the composition deposited on the substrate is more than one crystal phase.

12. The method of claim 1 in which said composition is selected from the group consisting of thioaluminates, thiogallates and thioindates of at least one cation from Groups IIA and IIB of the Periodic Table.

13. The method of claim 12 in which said substrate is opaque in the visible and infrared regions of the electromagnetic spectrum.

14. The method of claim 12 in which the composition is a ternary composition.

15. The method of claim 12 in which the composition is a quaternary composition.

16. The method of claim 12 in which said composition is of the formula $Ba_aCa_{1-a}Al_2S_4$:Eu, where "a" is the range of 0 to 1.

17. The method of claim 16 in which the composition is $CaAl_2S_4$:Eu.

18. The method of claim 12 in which the cation is selected from the group consisting of barium, calcium, strontium, magnesium, zinc and cadmium, and mixtures thereof.

* * * * *

UNITED STATES PATENT AND TRADEMARK OFFICE
CERTIFICATE OF CORRECTION

PATENT NO.    : 6,610,352 B2
DATED         : August 26, 2003
INVENTOR(S)   : Cheong It is certified that error appears in the above-identified patent and that said Letters Patent is hereby corrected as shown below:

<u>Title page,</u>
Item [56], References Cited, FOREIGN PATENT DOCUMENTS,
"EP 0 740 490 A1" should be -- EP 0 740 490 A1 10/96 --; and
"EP 0 720 418 7/1996 10/1996" should be -- EP 0 720 418 7/1996 --.

Signed and Sealed this

Twenty-third Day of December, 2003

JAMES E. ROGAN
*Director of the United States Patent and Trademark Office*